(12) United States Patent
Takeuchi

(10) Patent No.: US 10,622,974 B2
(45) Date of Patent: Apr. 14, 2020

(54) EQUALIZING CIRCUIT AND RECEIVER

(71) Applicant: TOSHIBA MEMORY CORPORATION, Minato-ku, Tokyo (JP)

(72) Inventor: Tomohiko Takeuchi, Funabashi Chiba (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/284,905

(22) Filed: Feb. 25, 2019

(65) Prior Publication Data

US 2020/0091899 A1    Mar. 19, 2020

(30) Foreign Application Priority Data

Sep. 18, 2018  (JP) ................................. 2018-173561

(51) Int. Cl.
| | |
|---|---|
| *H03H 7/30* | (2006.01) |
| *H03K 3/356* | (2006.01) |
| *H04L 25/03* | (2006.01) |
| *H03K 5/125* | (2006.01) |
| *H03K 19/0175* | (2006.01) |

(52) U.S. Cl.
CPC ......... *H03K 3/35613* (2013.01); *H03K 5/125* (2013.01); *H03K 19/0175* (2013.01); *H04L 25/03267* (2013.01)

(58) Field of Classification Search
CPC .......... H03K 3/35613; H03K 19/0175; H03K 5/125; H04L 25/03267
See application file for complete search history.

(56) References Cited

U.S. PATENT DOCUMENTS

| | | | |
|---|---|---|---|
| 8,477,833 B2 | 7/2013 | Bulzacchelli et al. | |
| 8,514,952 B2* | 8/2013 | Zerbe ..................... | H04L 7/0337 375/257 |
| 2008/0042732 A1* | 2/2008 | Bowers ..................... | G05F 3/26 327/538 |
| 2012/0027074 A1* | 2/2012 | Raghavan ......... | H04L 25/03057 375/233 |
| 2017/0264467 A1* | 9/2017 | Neto .................. | H04L 25/03057 |
| 2018/0241592 A1* | 8/2018 | Sakai .................... | H04L 25/063 |

FOREIGN PATENT DOCUMENTS

| | | |
|---|---|---|
| JP | 4213146 B2 | 1/2009 |
| JP | 2012-182710 A | 9/2012 |

* cited by examiner

*Primary Examiner* — Dhaval V Patel
(74) *Attorney, Agent, or Firm* — Foley & Lardner LLP

(57) ABSTRACT

An equalizing circuit may include a first signal line, a second signal line, a first current source, a first switch, a second switch, a second current source, a third switch, and a fourth switch. The second signal line forms a differential pair with the first signal line. The first switch connects the first signal line and the first current source. The second switch connects the second signal line and the first current source. The third switch connects the first signal line and the second current source. The fourth switch connects the second signal line and the second current source.

20 Claims, 6 Drawing Sheets

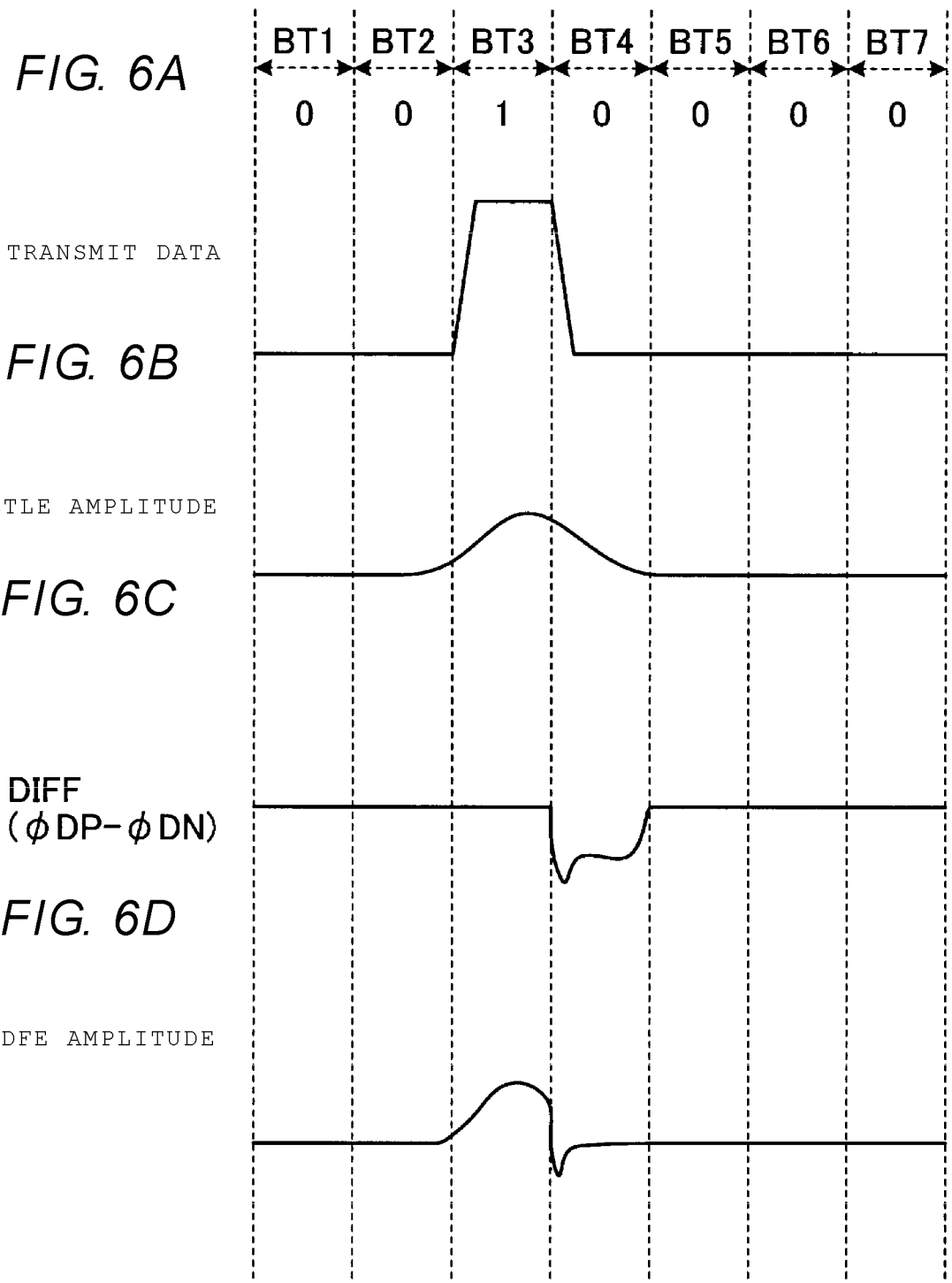

EQUALIZING CIRCUIT AND RECEIVER

CROSS-REFERENCE TO RELATED APPLICATIONS

This application claims the benefit of and priority to Japanese Patent Application No. 2018-173561, filed Sep. 18, 2018, the entire contents of which are incorporated herein by reference.

FIELD

Embodiments described herein relate generally to an equalizing circuit and a receiver.

BACKGROUND

In a communication system, wired communications may be performed by connecting a transmitting device and a receiving device by a wire communication channel. Enhancement of speed of such wired communications may be beneficial.

DESCRIPTION OF THE DRAWINGS

FIGS. 6A to 6D are waveform diagrams showing transmit data, CTLE amplitude, a differential signal, and DFE amplitude, according to an embodiment of the present disclosure.

DETAILED DESCRIPTION

Embodiments described herein provide for, among other things, an equalizing circuit and a receiver which can enhance a speed of wired communications.

In general, according to one embodiment, an equalizing circuit including a first signal line, a second signal line, a first current source, a first switch, a second switch, a second current source, a third switch, a fourth switch, a third current source, a fifth switch, a sixth switch, a seventh switch, and an eighth switch is provided. The second signal line forms a differential pair with the first signal line. The first switch connects the first signal line and the first current source. The second switch connects the second signal line and the first current source. The third switch connects the first signal line and the second current source. The fourth switch connects the second signal line and the second current source. The fifth switch connects the first signal line and the third current source. The sixth switch connects the second signal line and the third current source. The seventh switch is disposed between the first signal line and the third current source in parallel with the fifth switch. The seventh switch connects the first signal line and the third current source. The eighth switch is disposed between the second signal line and the third current source in parallel with the sixth switch. The eighth switch connects the second signal line and the third current source.

Hereinafter, an equalizing circuit according to an embodiment will be described in detail with reference to the accompanying drawings. The present disclosure is not limited to the described embodiment.

Figure 1:
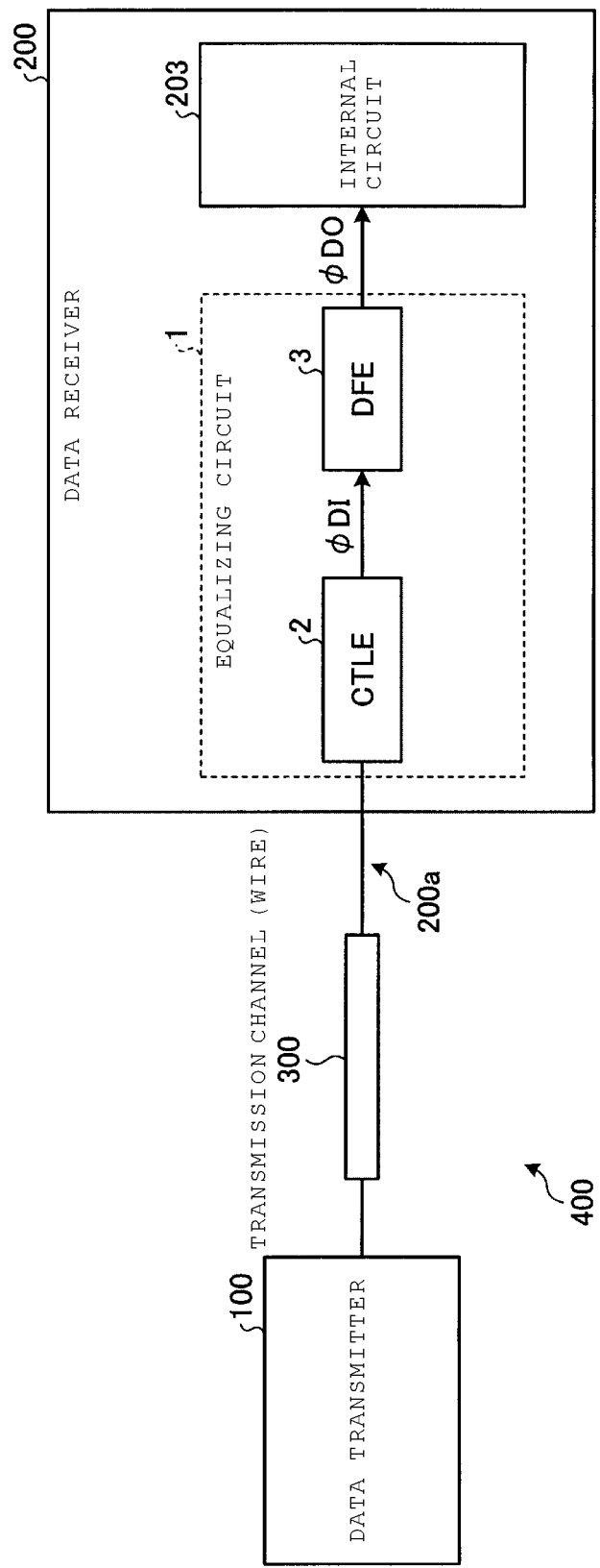
FIG. 1 is a block diagram depicting a configuration of a communication system including a data receiver provided with an equalizing circuit, according to an embodiment of the present disclosure.

A data receiver in which the equalizing circuit according to the embodiment is implemented will be described in reference to FIG. 1. FIG. 1 is a block diagram depicting a configuration of a communication system 400 including a data receiver 200 in which an equalizing circuit 1 is implemented.

The communication system 400 includes a data transmitter 100, the data receiver 200, and a wire communication channel 300. The data transmitter 100 and the data receiver 200 are connected so as to be capable of communicating with each other via the wire communication channel 300. The data transmitter 100 transmits data to the data receiver 200 via the wire communication channel 300. The data receiver 200 has a reception node 200a to which the wire communication channel 300 can be connected, and the reception node 200a can receive data from the data transmitter 100 via the wire communication channel 300.

The data transmitter 100 transmits, to the data receiver 200 via the wire transmission channel 300, a modulated signal obtained by performing predetermined modulation (for example, binary modulation such as non-return to zero (NRZ) modulation) on data to be transmitted. The data receiver 200 includes the equalizing circuit 1 and an internal circuit 203. The equalizing circuit 1 is electrically connected to the reception node 200a. The equalizing circuit 1 restores or reconstructs data ϕDO by performing equalization on the modulated signal and outputting the data ϕDO to the internal circuit 203.

Figure 2A:
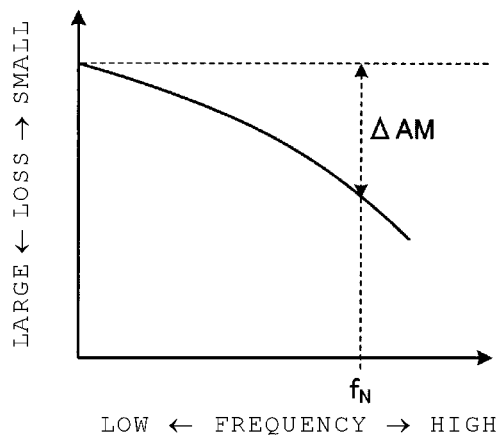
FIGS. 2A to 2C are diagrams showing frequency characteristics of a wire communication channel, a continuous time linear equalizer (CTLE) circuit, and a decision feedback equalizer (DFE) circuit, according to an embodiment of the present disclosure.
Figure 2B:
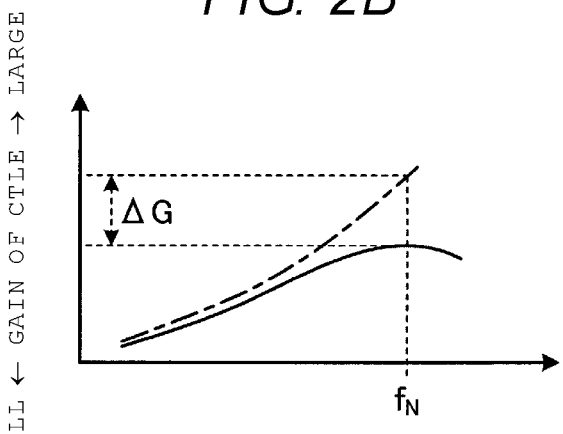
Figure 2C:
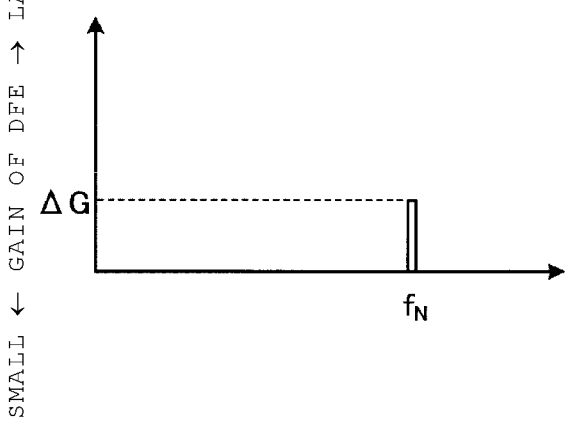

FIGS. 2A to 2C are diagrams showing frequency characteristics of the wire communication channel, the CTLE circuit, and the DFE circuit, respectively. Wired communications may involve a high data rate and/or high frequencies. In the wire communication channel 300, due to channel losses caused by skin effects and dielectric loss, for example, of a conductor, as shown in FIG. 2A, a high-frequency component of a loss of signal strength in a transmission signal may be larger than a low-frequency component of that. At the Nyquist frequency (half of the data transfer rate in NRZ) $f_N$, a loss of signal strength of the modulated signal is $\Delta$AM. Here, the signal strength corresponds to a gain of one or more components in a signal transmission path.

The equalizing circuit 1 depicted in FIG. 1 can compensate for such attenuation to at least some extent, and includes a CTLE circuit 2 that performs first stage equalization. As shown in FIG. 2B by an alternate long and short dashed line, the gain characteristics of the CTLE circuit 2 may be designed so as to have inverse or compensatory characteristics for the attenuation characteristics of the wire communication channel 300. In practice, as shown in FIG. 2B by a solid line, for the characteristics shown by the alternate long and short dashed line, an attenuation of $\Delta$G occurs at the Nyquist frequency $f_N$.

The equalizing circuit 1 depicted in FIG. 1 includes a DFE circuit 3 that performs second stage equalization. The DFE circuit 3 may be designed so as to have a gain of about $\Delta$G near the Nyquist frequency $f_N$ as shown in FIG. 2C by a solid line. The DFE circuit 3 compensates for degradation of an input signal by a gain of about ΔG corresponding to a degradation in signal strength caused by an influence of a past input signal on a present input signal, so as to compensate for intersymbol interference (ISI).

The DFE circuit 3 performs waveform equalization corresponding to a gain of about ΔG by one or more processes that include determining whether data obtained through N (N is an integer greater than or equal to 2) cycles earlier corresponds to a 0 or 1, multiplying each of the results by a coefficient (referred to herein as a TAP coefficient), and providing feedback. A circuit that provides feedback in this manner will be referred to as a TAP circuit or a feedback circuit, and the number N of TAP circuits will be referred to as the number of TAPs.

Figure 3:
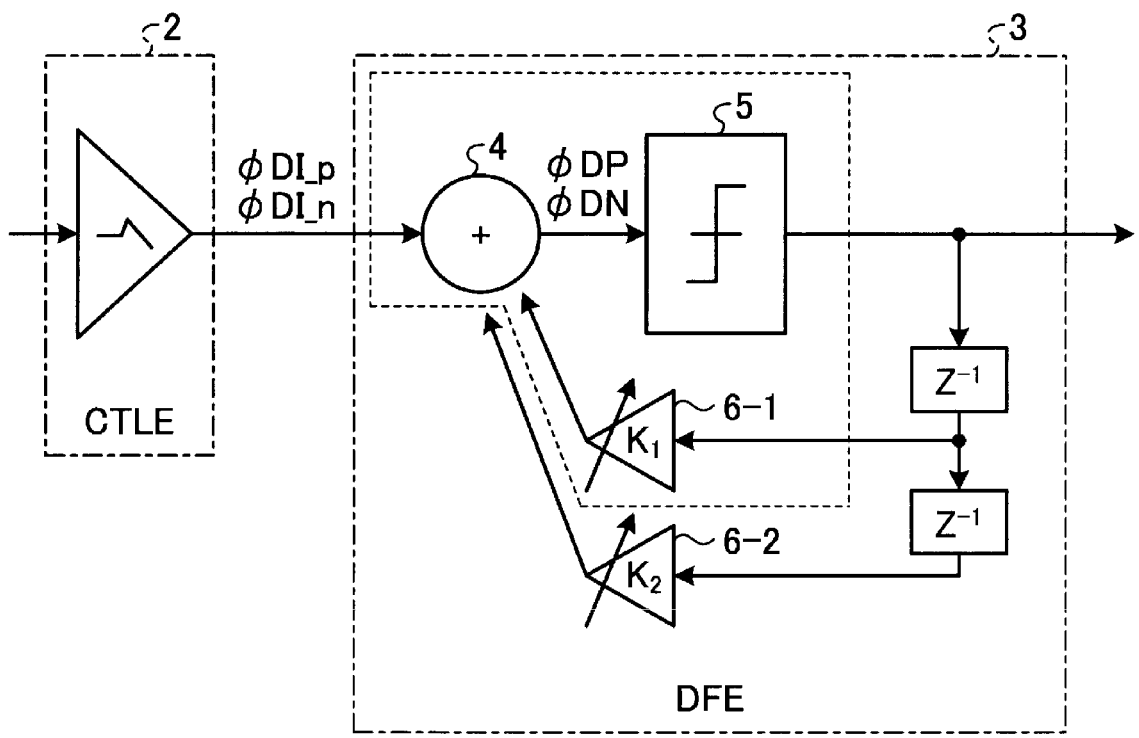
FIG. 3 is a circuit diagram depicting a schematic configuration of a DFE circuit, according to an embodiment of the present disclosure.

The DFE circuit 3 includes, as depicted in FIG. 3, a summer circuit 4, a decision circuit 5, and N TAP circuits 6-1 to 6-N. FIG. 3 is a circuit diagram depicting a schematic configuration of the DFE circuit 3. In FIG. 3, a case where the number N of TAPs=2 is illustrated. Another number of TAPs may be implemented in other embodiments.

The summer circuit 4 is disposed between the CTLE circuit 2 and the decision circuit 5. The TAP circuits 6-1 to 6-N are disposed on feedback paths returning from output nodes of the decision circuit 5 to the summer circuit 4. The TAP circuits 6-1 to 6-N implement TAP coefficients $K_1$ to $K_N$ for multiplication operations.

The summer circuit 4 can receive a pair of differential signals ϕDI_p and ϕDI_n from the CTLE circuit 2 as a signal ϕDI. The summer circuit 4 adds the signal fed back from each TAP circuit 6 (for example, adds a current) to each of the differential signals ϕSI_p and ϕDI_n and supplies differential signals ϕDP and ϕDN, which are the addition results, to the decision circuit 5.

For instance, the decision circuit 5 makes a decision as to whether each of the supplied differential signals ϕDP and ϕDN is logical 0 or 1 and supplies a signal, which is the decision result, to the TAP circuit 6-1 and to an output node, circuit, or device. The TAP circuit 6-1 multiplies the signal supplied from the decision circuit 5 by the TAP coefficient $K_1$ and feeds the resultant signal back to the summer circuit 4.

Figure 4:
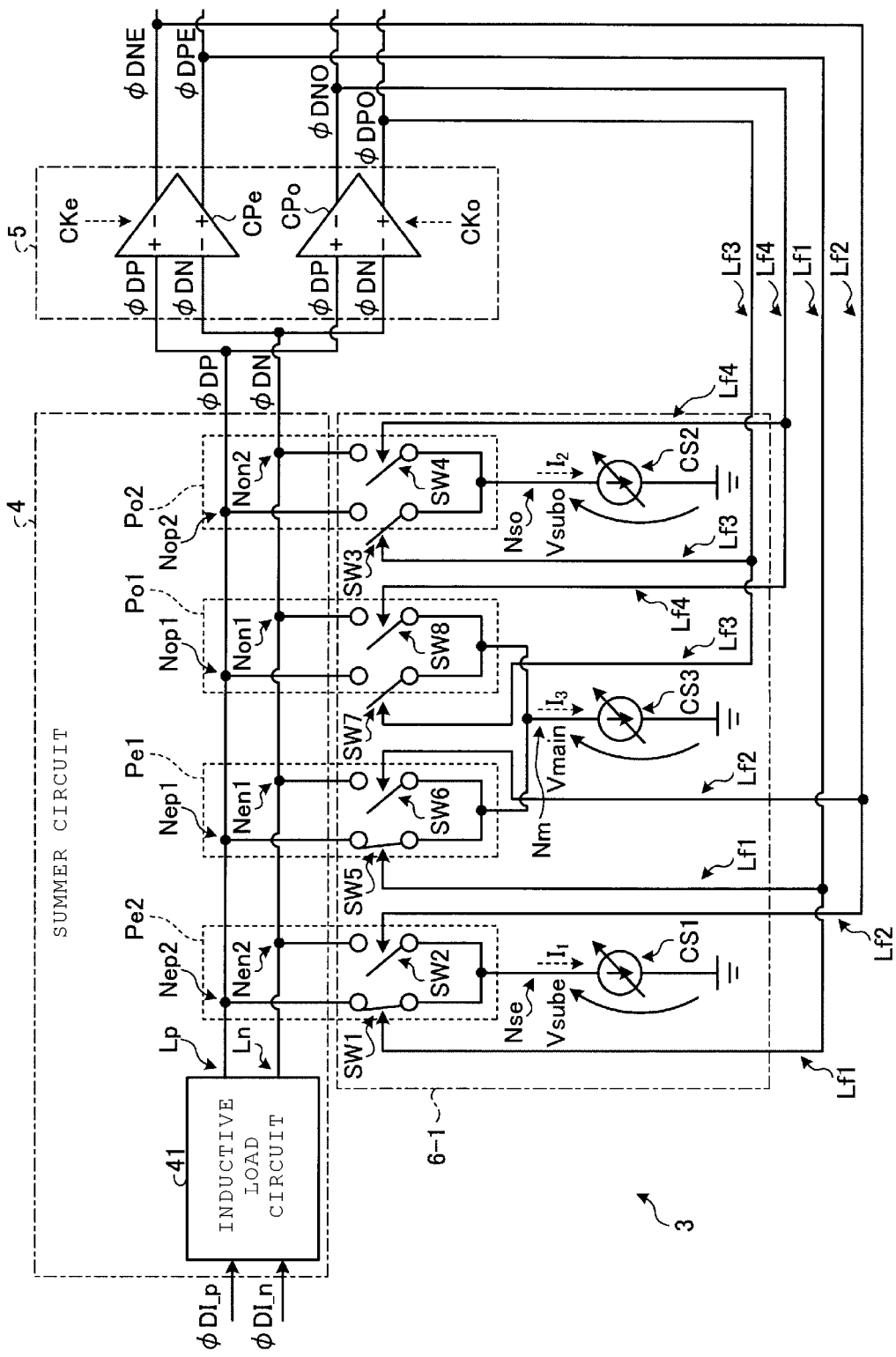
FIG. 4 is a circuit diagram depicting an example configuration of a DFE circuit, according to an embodiment of the present disclosure.

A portion of the DFE circuit 3 enclosed by a dashed line in FIG. 3 may be configured as depicted in FIG. 4. FIG. 4 is a circuit diagram depicting an example configuration of at least a portion of the DFE circuit 3.

In the DFE circuit 3 depicted in FIG. 4, the decision circuit 5 is disposed on the output side of the summer circuit 4, the output nodes of the decision circuit 5 and control nodes of the TAP circuit 6-1 are connected by a plurality of feedback lines Lf1, Lf2, Lf3, and Lf4, and output nodes of the TAP circuit 6-1 are connected to current addition nodes of the summer circuit 4.

Moreover, to enhance the speed of operations, the DFE circuit 3 may implement an interleaved configuration including a configuration of an Even system corresponding to an even-number-th edge in a base clock and a configuration of an Odd system corresponding to an odd-number-th edge in the base clock.

The summer circuit 4 includes at least an inductive load circuit 41, a signal line Lp, a signal line Ln, and current addition nodes Nep1, Nop1, Nen1, and Non1. In the summer circuit 4, the current addition nodes Nep1 and Nen1 are component elements of the Even system and form part of a current addition path Pe1 for Even. The current addition nodes Nop1 and Non1 are component elements of the Odd system and form part of a current addition path Pot for Odd.

The signal line Lp and the signal line Ln form a differential pair, and the signal line Lp transmits the P-side differential signal ϕDP and the signal line Ln transmits the N-side differential signal ϕDN. On the signal line Lp, the current addition node Nep1 and the current addition node Nop1 are disposed. On the signal line Ln, the current addition node Nen1 and the current addition node Non1 are disposed.

The decision circuit 5 includes a comparator CPe and a comparator CPo. In the decision circuit 5, the comparator CPe is a component element of the Even system and performs a comparison operation in synchronism with a clock CKe for Even. The comparator CPo is a component element of the Odd system and performs a comparison operation in synchronism with a clock CKo for Odd.

The comparator CPe is a differential input-differential output comparator. The comparator CPe is electrically connected to one end of the signal line Lp and one end of the signal line Ln in parallel with the comparator CPo. The comparator CPo is a differential input-differential output comparator. The comparator CPo is electrically connected to one end of the signal line Lp and one end of the signal line Ln in parallel with the comparator CPe.

The clock CKe for Even, which is used by the comparator CPe, is a clock corresponding to the even-number-th edge in the base clock. Such a clock may also be referred to herein as an even clock. The clock CKo for Odd, which is used by the comparator CPo, is a clock corresponding to the odd-number-th edge in the base clock. Such a clock may also be referred to herein as an odd clock. Some embodiments described herein include one or more clock signal generators that generate the clock CKe and/or the clock CKo.

Of the plurality of feedback lines Lf1, Lf2, Lf3, and Lf4, the feedback lines Lf1 and Lf2 are component elements of the Even system, and output nodes of the comparator CPe for Even are connected to some of the control nodes of the TAP circuit 6-1. The feedback lines Lf3 and Lf4 are component elements of the Odd system, and output nodes of the comparator CPo for Odd are connected to some of the other control nodes of the TAP circuit 6-1.

The TAP circuit 6-1 includes a current source CS3, a switch SW5, a switch SW6, a switch SW7, and a switch SW8. In the TAP circuit 6-1, the switch SW5 and the switch SW6 are component elements of the Even system, have control nodes to which the feedback lines Lf1 and Lf2 for Even are connected, and form part of the current addition path Pe1 for Even. The switch SW7 and the switch SW8 are component elements of the Odd system, have control nodes to which the feedback lines Lf3 and Lf4 for Odd are connected, and form part of the current addition path Po1 for Odd.

The switch SW5 is disposed between the current addition node Nep1 and the current source CS3 and can connect the signal line Lp and the current source CS3. The switch SW6 is disposed between the current addition node Nen1 and the current source CS3 and can connect the signal line Ln and the current source CS3. The switch SW7 is disposed between the signal line Lp and the current source CS3 in parallel with the switch SW5, and is disposed between the current addition node Nop1 and the current source CS3 and can connect the signal line Lp and the current source CS3. The switch SW8 is disposed between the signal line Ln and the current source CS3 in parallel with the switch SW6, and is disposed between the current addition node Non1 and the current source CS3 and can connect the signal line Ln and the current source CS3.

The switch SW5 is turned on when a feedback signal φDPE for Even, which is received via the feedback line Lf1, becomes high level and turned off when the feedback signal φDPE for Even becomes low level. The switch SW6 is turned on when a feedback signal φDNE for Even, which is received via the feedback line Lf2, becomes high level and turned off when the feedback signal φDNE for Even becomes low level. The switch SW7 is turned on when a feedback signal φDPO for Odd, which is received via the feedback line Lf3, becomes high level and turned off when the feedback signal φDPO for Odd becomes low level. The switch SW8 is turned on when a feedback signal ONO for Odd, which is received via the feedback line Lf4, becomes high level and turned off when the feedback signal φDNO for Odd becomes low level.

Figure 5:
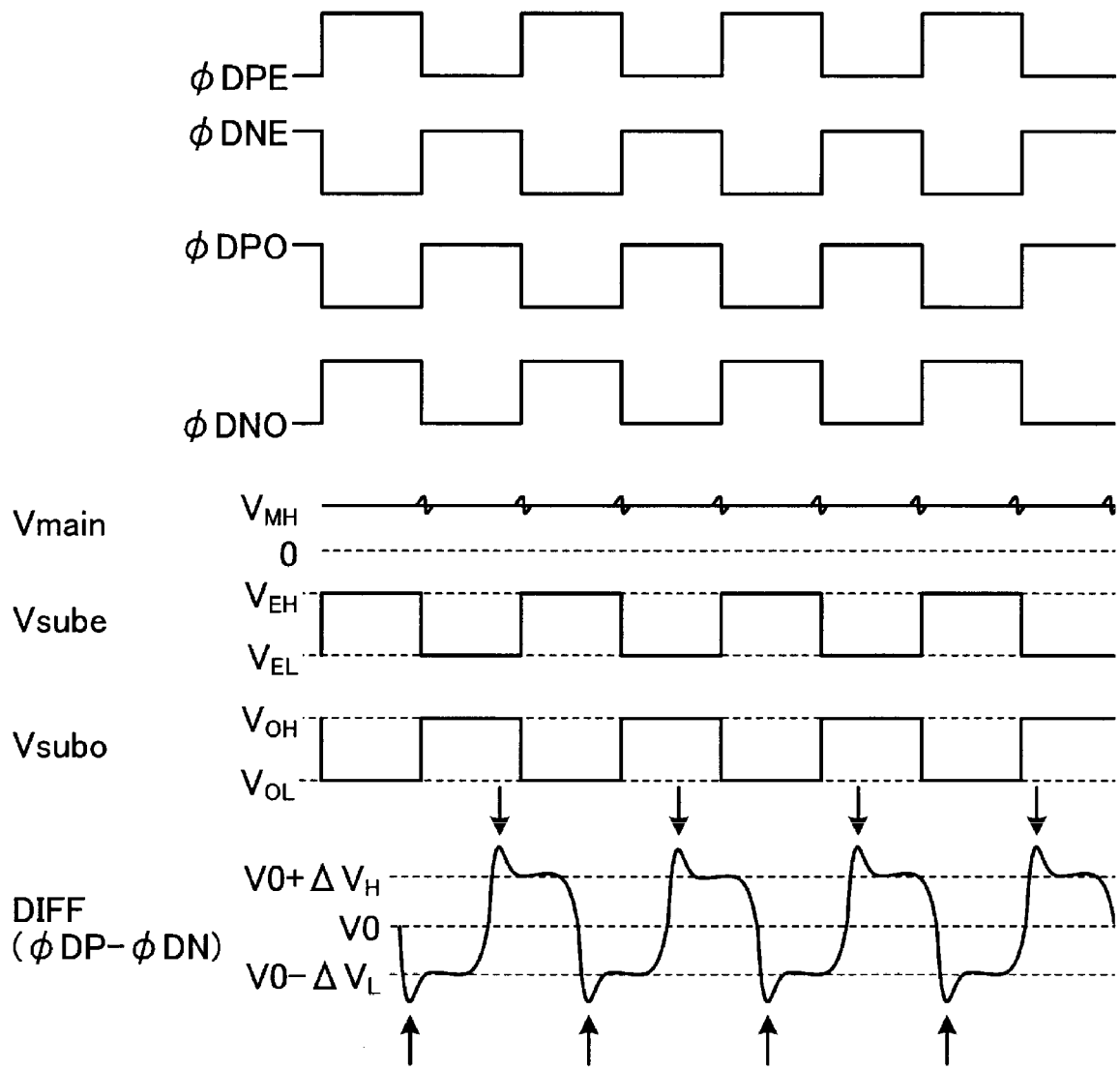
FIG. 5 is a waveform diagram showing feedback signals and a TAP response (described in more detail below), according to an embodiment of the present disclosure.

As a result of the clock CKe for Even and the clock CKo for Odd being complementary clocks, the feedback signals φDPE and φDNE for Even and the feedback signals φDPO and φDNO for Odd, which are fed back from the decision circuit 5-1, become active in a complementary manner as shown in FIG. 5. For example, the signals φDPE and φDNO may become high at approximately a same time or may become low at approximately a same time, and the signals φSNE and φDPO may become high at approximately a same time or may become low at approximately a same time. FIG. 5 is a waveform diagram showing feedback signals and a TAP response.

In response to this, in the configuration depicted in FIG. 4, the current addition path Pe1 for Even and the current addition path Po1 for Odd become active in a complementary manner.

Since the current source CS3 is connected to both the current addition path Pe1 for Even and the current addition path Po1 for Odd, a common connection node Nm is connected to the signal lines Lp and Ln. In the configuration including the current addition path Pe1 for Even and the current addition path Po1 for Odd, there is no period in which the switches SW5 to SW8 are concurrently maintained in an off state, and one of the switches SW5 to SW8 is turned on and thereby maintains a state in which the current source CS3 is connected to the signal lines Lp and Ln.

As a result, a potential Vmain of the common connection node Nm can maintain an approximately constant value (for instance, about 0.5 to about 0.6 V, or can have an amplitude within a range of about 0.1 V to about 0.3 V) as shown in FIG. 5. For example, if H level of the signal lines Lp and Ln is about 0.5 V and L level is about 0.1 V, the current source CS3 has to extract electric charges from the signal lines Lp and Ln in order to pull the signal lines Lp and Ln down to L level. However, since it can be challenging to ensure a potential difference between a power-supply-side node of the current source CS3 and the signal lines Lp and Ln, it tends to take time to extract electric charges from the signal lines Lp and Ln. It is challenging for the current source CS3 to drive the potential of the signal lines Lp and Ln at high speed when the current addition path Pe1 or the current addition path Po1 becomes active. This may make it challenging to enhance the speed of the operations of the DFE circuit 3.

Thus, in the presently described embodiment, by implementing current sources CS1 and CS2 and current addition paths Pe2 and Po2, which are supplementary to the current source CS3 and the current addition paths Pe1 and Po1, to the DFE circuit 3, the speed of the operations of the DFE circuit 3 may be enhanced.

The summer circuit 4 may further include current addition nodes Nep2, Nop2, Nen2, and Non2. In the summer circuit 4, the current addition nodes Nep2 and Nen2 form part of the current addition path Pe2 for Even. The current addition nodes Nop2 and Non2 form part of the current addition path Po2 for Odd.

The TAP circuit 6-1 further includes the current source CS1, the current source CS2, a switch SW1, a switch SW2, a switch SW3, and a switch SW4. In the TAP circuit 6-1, the switch SW1 and the switch SW2 have control nodes to which the feedback lines Lf1 and Lf2 for Even are connected, and form part of the current addition path Pe2 for Even. The switch SW3 and the switch SW4 have control nodes to which the feedback lines Lf3 and Lf4 for Odd are connected, and form part of the current addition path Po2 for Odd.

The switch SW1 is disposed between the current addition node Nep2 and the current source CS1 and connects the signal line Lp and the current source CS1. The switch SW2 is disposed between the current addition node Nen2 and the current source CS1 and connects the signal line Ln and the current source CS1. The switch SW3 is disposed between the current addition node Nop2 and the current source CS2 and connects the signal line Lp and the current source CS2. The switch SW4 is disposed between the current addition node Non2 and the current source CS2 and connects the signal line Ln and the current source CS2.

A current I1 of the current source CS1 and a current I2 of the current source CS2 are approximately equal. The value of the ratio of a current I3 of the current source CS3 to the current I1 of the current source CS1 is approximately equal to the value of the ratio of the current I3 of the current source CS3 to the current I2 of the current source CS2. For example, if α is assumed to be a positive number (for instance, α=0.125), I1:I3 is about equal to I2:I3 is about equal to α:1. As a result, the current source CS1 and the current source CS3 can supply a specified current to the signal lines Lp and Ln in cooperation with each other, and the current source CS2 and the current source CS3 can supply a specified current to the signal lines Lp and Ln in cooperation with each other.

As a result of the clock CKe for Even and the clock CKo for Odd being complementary clocks, the feedback signals φDPE and φDNE for Even and the feedback signals φDPO and ONO for Odd, which are fed back from the decision circuit 5, become active in a complementary manner as shown in FIG. 5. For example, the signals φDPE and φDNO may become high at approximately a same time or may become low at approximately a same time, and the signals φDNE and φDPO may become high at approximately a same time or may become low at approximately a same time.

Thus in a sub-configuration (the current sources CS1 and CS2 and the current addition paths Pe2 and Po2) which is supplementary to a main configuration (the current source CS3 and the current addition paths Pe1 and Po1), the current addition path Pe2 for Even and the current addition path Po2 for Odd become active in a complementary manner.

A configuration including the current source CS1 and the current addition path Pe2 for Even and a configuration including the current source CS2 and the current addition path Po2 for Odd are independently provided. In the current addition path Pe2 for Even, there is a period in which the switch SW1 is maintained in an off state and a state in which the current source CS1 is electrically cut off from the signal line Lp. Moreover, in the current addition path Pe2 for Even, there is a period in which the switch SW2 is maintained in an off state and a state in which the current source CS1 is electrically cut off from the signal line Ln. Likewise, in the current addition path Po2 for Odd, there is a period in which the switch SW3 is maintained in an off state and a state in which the current source CS2 is electrically cut off from the signal line Lp. Moreover, in the current addition path Po2 for Odd, there is a period in which the switch SW4 is maintained in an off state and a state in which the current source CS2 is electrically cut off from the signal line Ln.

As a result, a potential Vsube of a connection node Nse between the current source CS1 and the current addition path Pe2 for Even repeatedly transitions between a high-level value $V_{EH}$ (for example, about 0.6 V) and a low-level value $V_{EL}$ (for example, about 0.1 V) as shown in FIG. 5. For instance, if H level of the signal lines Lp and Ln is about 0.5 V and L level is about 0.1 V, the current source CS3 extracts electric charges from the signal lines Lp and Ln in order to pull the signal lines Lp and Ln down to L level. However, since the current source CS1 and the current addition path Pe2 for Even provide for readily ensuring the potential difference between a power-supply-side node of the current source CS1 and the signal lines Lp and Ln and make it possible to use the movement of electric charges by the potential difference, it is possible to extract the electric charges from the signal lines Lp and Ln at high speed. Since it is possible to use the movement of electric charges by the potential difference when the current addition path Pe2 becomes active and the switches SW1 and SW2 are turned on, the current source CS1 readily drives the potential of the signal lines Lp and Ln at high speed.

Likewise, the potential Vsubo of a connection node Nso between the current source CS2 and the current addition path Po2 for Odd repeatedly transitions between a high-level value $V_{OH}$ (for example, about 0.6 V) and a low-level value $V_{OL}$ (for example, about 0.1 V). For instance, if H level of the signal lines Lp and Ln is about 0.5 V and L level is about 0.1 V, the current source CS3 extracts electric charges from the signal lines Lp and Ln in order to pull the signal lines Lp and Ln down to L level. However, since the current source CS2 and the current addition path Po2 for Odd provide for readily ensuring the potential difference between a power-supply-side node of the current source CS2 and the signal lines Lp and Ln and make it possible to use the movement of electric charges by the potential difference, it is possible to extract the electric charges from the signal lines Lp and Ln at high speed. Since it is possible to use the movement of electric charges by the potential difference when the current addition path Po2 becomes active and the switches SW3 and SW4 are turned on, the current source CS2 readily drives the potential of the signal lines Lp and Ln at high speed.

In response to this, since the waveform of a differential signal DIFF between the signal φDP which is transmitted over the signal line Lp and the signal ON which is transmitted over the signal line Ln (a difference voltage between the voltage value of the signal φDP and the voltage value of the signal φDN) overshoots or undershoots with timing indicated by arrows as shown in FIG. 5, it is possible to make the signal level of the differential signal DIFF transition at high speed. This makes it possible to enhance the speed of response to the TAP circuit 6-1 (the TAP response speed) in the DFE circuit 3 and readily enhance the speed of the operations of the DFE circuit 3.

For example, as shown in FIG. 6A, assume that transmit data of bit values "0" "0" "1" "0" "0" "0" "0" is transmitted from the data transmitter 100 in bit times BT1, BT2, BT3, BT4, BT5, BT6, and BT7. In this case, a waveform which is observed when the amount of equalization in the CTLE circuit 2 is insufficient for a loss of a communications path changes from the bit time BT3 to the bit time BT4 as shown in FIG. 6B. At this time, the waveform of a differential signal between the signals φDP and φDN in the DFE circuit 3 has transient response characteristics at the start of the bit time BT4 as shown in FIG. 6C. As a result, in a waveform obtained in the DFE circuit 3 by equalization, a steep response occurs at the start of the bit time BT4 as shown in FIG. 6D. The equalizing circuit 1 including the CTLE circuit 2 and the DFE circuit 3 can effectively correct data in the bit time BT3 to a level corresponding to the bit value "1" by equalization and avoid a situation in which data in the bit time BT4 is corrected to an improper level by equalization.

FIGS. 6A to 6D are waveform diagrams showing transmit data, CTLE amplitude, DIFF, and DFE amplitude.

As described above, in the presently described embodiment, the current sources CS1 and CS2 and the current addition paths Pe2 and Po2, which are supplementary to the current source CS3 and the current addition paths Pe1 and Pot, are implemented in the DFE circuit 3. This makes it possible to readily enhance the speed of the operations of the DFE circuit 3. As a result, it is possible to readily enhance the speed of wired communications from the data transmitter 100 to the data receiver 200 via the wire transmission channel 300.

If the ratio of the current I3 of the current source CS3 to the current I1 of the current source CS1 and the ratio of the current I3 of the current source CS3 to the current I2 of the current source CS2 is I1:I3, which is about equal to I2:I3, which is about equal to α:1 (α is a positive number), it is possible to adjust the TAP response speed by changing α. By making α larger, it is possible to enhance the TAP response speed. For instance, when the current source CS1, the current source CS2, and the current source CS3 are configured with MOS transistors, by making dimensions of the current source CS1 and dimensions of the current source CS2 (e.g., W/L, W: channel width, L: channel length) larger than dimensions of the current source CS3, it is possible to make α larger.

As used herein, the terms "about," "approximately," and "substantially" are used to describe and account for small variations. When used in conjunction with an event or circumstance, the terms "about," "approximately," and "substantially" can refer to instances in which the event or circumstance occurs precisely as well as instances in which the event or circumstance occurs to a close approximation. For example, when used in conjunction with a numerical value, the terms "about," "approximately," and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An equalizing circuit comprising:
   a first signal line;
   a second signal line that forms a differential pair with the first signal line;
   a first current source;
   a first switch that connects the first signal line and the first current source;
   a second switch that connects the second signal line and the first current source;
   a second current source;
   a third switch that connects the first signal line and the second current source;
   a fourth switch that connects the second signal line and the second current source;
   a third current source;
   a fifth switch that connects the first signal line and the third current source;
   a sixth switch that connects the second signal line and the third current source;
   a seventh switch that is disposed between the first signal line and the third current source in parallel with the fifth switch and connects the first signal line and the third current source; and
   an eighth switch that is disposed between the second signal line and the third current source in parallel with the sixth switch and connects the second signal line and the third current source.

2. The equalizing circuit according to claim 1, further comprising:
   a first comparator that is electrically connected to the first signal line and to the second signal line;
   a second comparator that is electrically connected to the first signal line and to the second signal line in parallel with the first comparator;
   a first feedback line that is connected to an output side of the first comparator, to a control node of the first switch, and to a control node of the fifth switch;
   a second feedback line that is connected to the output side of the first comparator, to a control node of the second switch, and to a control node of the sixth switch;
   a third feedback line that is connected to an output side of the second comparator, to a control node of the third switch, and to a control node of the seventh switch; and
   a fourth feedback line that is connected to the output side of the second comparator, to a control node of the fourth switch, and to a control node of the eighth switch.

3. The equalizing circuit according to claim 1, wherein
   a value of a ratio of a current value of the third current source to a current value of the first current source is approximately equal to a value of a ratio of the current value of the third current source to a current value of the second current source.

4. The equalizing circuit according to claim 1, wherein the equalizing circuit is configured such that:
   there is no period in which the fifth switch and the seventh switch are concurrently maintained in an off state with respect to a signal transmitted by the first signal line, and
   there is no period in which the sixth switch and the eighth switch are concurrently maintained in an off state with respect to a signal transmitted by the second signal line.

5. The equalizing circuit according to claim 1, further comprising:
   a first comparator that is electrically connected to the first signal line and to the second signal line;
   a second comparator that is electrically connected to the first signal line and to the second signal line in parallel with the first comparator;
   a first feedback line that is connected to an output side of the first comparator and to a control node of the first switch;
   a second feedback line that is connected to the output side of the first comparator and to a control node of the second switch;
   a third feedback line that is connected to an output side of the second comparator and to a control node of the third switch; and
   a fourth feedback line that is connected to the output side of the second comparator and to a control node of the fourth switch.

6. The equalizing circuit according to claim 1, wherein
   a current value of the first current source and a current value of the second current source are approximately equal.

7. A receiving device comprising:
   the equalizing circuit according to claim 1; and
   a reception node to which a wire transmission channel is connectable, wherein the equalizing circuit is electrically connected to the reception node.

8. The receiving device according to claim 7, wherein the equalizing circuit further comprises:
   a first comparator that is electrically connected to the first signal line and to the second signal line;
   a second comparator that is electrically connected to the first signal line and to the second signal line in parallel with the first comparator;
   a first feedback line that is connected to an output side of the first comparator and to a control node of the first switch;
   a second feedback line that is connected to the output side of the first comparator and to a control node of the second switch;
   a third feedback line that is connected to an output side of the second comparator and to a control node of the third switch; and
   a fourth feedback line that is connected to the output side of the second comparator and to a control node of the fourth switch.

9. An equalizing circuit comprising:
   a summer circuit that includes at least a portion of a first signal line and a second signal line that forms a differential pair with the first signal line;
   a decision circuit comprising:
      an even comparator that is electrically connected to the first signal line and to the second signal line, and is configured to perform a comparison operation in synchronism with an even clock; and
      an odd comparator that is electrically connected to the first signal line and to the second signal line in parallel with the even comparator, and is configured to perform a comparison operation in synchronism with an odd clock;
   a feedback circuit configured to selectively electrically connect to the first signal line and the second signal line, and to receive an output from the even comparator and an output from the odd comparator;
   a first current source;
   a first switch that connects the first signal line and the first current source;
   a second switch that connects the second signal line and the first current source;

a second current source;
a third switch that connects the first signal line and the second current source; and
a fourth switch that connects the second signal line and the second current source.

10. The equalizing circuit of claim 9, wherein the even clock corresponds to an even-number-th edge of a base clock, and the odd clock corresponds to an odd-number-th edge of the base clock.

11. The equalizing circuit of claim 9, further comprising:
a first feedback line that is connected to an output side of the even comparator and to a control node of the first switch;
a second feedback line that is connected to the output side of the even comparator and to a control node of the second switch;
a third feedback line that is connected to an output side of the odd comparator and to a control node of the third switch; and
a fourth feedback line that is connected to the output side of the odd comparator and to a control node of the fourth switch.

12. The equalizing circuit of claim 11, wherein:
the portion of the first signal line included in the summer circuit includes a first even current addition node configured to electrically connect to the first current source via the first switch and a first odd current addition node configured to electrically connect to the second current source via the third switch; and
the portion of the second signal line included in the summer circuit includes a second even current addition node configured to electrically connect to the first current source via the second switch and a second odd current addition node configured to electrically connect to the second current source via the fourth switch.

13. The equalizing circuit of claim 12, wherein:
the first even current addition node and the second even current addition node define at least a portion of an even current addition path,
the first odd current addition node and the second odd current addition node define at least a portion of an odd current addition path, and
the even current addition path and the odd current addition path are configured to become active in a complementary manner.

14. The equalizing circuit of claim 13, wherein:
the even comparator is configured to output a first output signal and a second output signal, and
the odd comparator is configured to output a third output signal and a fourth output signal, such that
the first output signal of the even comparator and the fourth output signal of the odd comparator become high or low at approximately a same time, and
the second output signal of the even comparator and the third output signal of the odd comparator become high or low at approximately a same time.

15. The equalizing circuit of claim 9, wherein the feedback circuit further comprises:
a third current source;
a fifth switch that connects the first signal line and the third current source;
a sixth switch that connects the second signal line and the third current source;
a seventh switch that is disposed between the first signal line and the third current source in parallel with the fifth switch and connects the first signal line and the third current source; and
an eighth switch that is disposed between the second signal line and the third current source in parallel with the sixth switch and connects the second signal line and the third current source.

16. The equalizing circuit of claim 15, wherein the feedback circuit includes a common connection node disposed between the third current source and each of the fifth switch, the sixth switch, the seventh switch, and eighth switch, and wherein the feedback circuit is configured such that an approximately constant voltage is maintain at the common connection node.

17. The equalizing circuit of claim 9, wherein the feedback circuit is one of a plurality of feedback circuits that are each configured to selectively electrically connect to the first signal line and the second signal line, and to receive an output signal of the even comparator and an output signal of the odd comparator.

18. The receiving device according to claim 7, further comprising:
a first comparator that is electrically connected to the first signal line and to the second signal line;
a second comparator that is electrically connected to the first signal line and to the second signal line in parallel with the first comparator;
a first feedback line that is connected to an output side of the first comparator, to a control node of the first switch, and to a control node of the fifth switch;
a second feedback line that is connected to the output side of the first comparator, to a control node of the second switch, and to a control node of the sixth switch;
a third feedback line that is connected to an output side of the second comparator, to a control node of the third switch, and to a control node of the seventh switch; and
a fourth feedback line that is connected to the output side of the second comparator, to a control node of the fourth switch, and to a control node of the eighth switch.

19. The receiving device according to claim 7, wherein a value of a ratio of a current value of the third current source to a current value of the first current source is approximately equal to a value of a ratio of the current value of the third current source to a current value of the second current source.

20. The receiving device according to claim 7, wherein a current value of the first current source and a current value of the second current source are approximately equal.

* * * * *